United States Patent
Ishimatsu

(10) Patent No.: US 6,827,880 B2
(45) Date of Patent: Dec. 7, 2004

(54) ANISOTROPIC CONDUCTIVE ADHESIVE

(75) Inventor: Tomoyuki Ishimatsu, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 301 days.

(21) Appl. No.: 10/013,373

(22) Filed: Dec. 13, 2001

(65) Prior Publication Data

US 2002/0109124 A1 Aug. 15, 2002

(30) Foreign Application Priority Data

Dec. 15, 2000 (JP) ........................................ 2000-381939

(51) Int. Cl.$^7$ ............................... H01B 1/20; C09J 4/06; C09J 9/02; H01R 11/00; H01R 4/04
(52) U.S. Cl. ...................... 252/511; 252/512; 252/514; 252/518.1; 252/502; 252/500; 525/44; 525/48; 525/921
(58) Field of Search ............................... 252/511, 512, 252/514, 518.1, 502, 500; 525/44, 48; 500/921; 349/122; 361/683

(56) References Cited

U.S. PATENT DOCUMENTS

| | | | | |
|---|---|---|---|---|
| 5,972,272 A | * | 10/1999 | Nagase et al. | 264/324 |
| 6,039,896 A | * | 3/2000 | Miyamoto et al. | 252/511 |
| 6,527,984 B1 | * | 3/2003 | Ishimatsu | 252/500 |

FOREIGN PATENT DOCUMENTS

| | | | | |
|---|---|---|---|---|
| JP | 09-291259 | * | 11/1997 | ......... C09J/4/06 |
| JP | A 10-147762 | | 6/1998 | |
| JP | 10-168412 | * | 6/1998 | ......... C09J/9/02 |
| JP | 10-338844 | | 12/1998 | |
| JP | 11-279512 | | 10/1999 | |
| JP | 2000-104032 | | 4/2000 | |
| JP | 2000-104035 | | 4/2000 | |
| JP | 2000-239616 | | 9/2000 | |
| JP | 2000-265117 | | 9/2000 | |
| JP | 2000-265120 | | 9/2000 | |
| JP | 2000-281914 | | 10/2000 | |
| JP | 2000-290597 | | 10/2000 | |
| JP | 2001-019912 | | 1/2001 | |
| JP | 2001-031914 | | 2/2001 | |
| JP | 2001-156430 | | 6/2001 | |
| JP | 2001-160671 | | 6/2001 | |
| JP | 2001-176335 | | 6/2001 | |
| JP | 2001-181358 | | 7/2001 | |
| JP | 2001-181595 | * | 7/2001 | ......... C09J/171/10 |
| JP | 2001-323224 | | 11/2001 | |
| JP | 2001-012637 | | 1/2002 | |
| JP | 2002-012603 | | 1/2002 | |
| JP | 2002-012738 | | 1/2002 | |
| WO | WO 98/44067 | | 10/1998 | |

OTHER PUBLICATIONS

Organic Peroxides (Nihon Yushi Co. Catalog No. 6) p.6.

* cited by examiner

Primary Examiner—Mark Kopec
Assistant Examiner—Kallambella Vijayakumar
(74) Attorney, Agent, or Firm—Oliff & Berridge, PLC

(57) ABSTRACT

An anisotropic conductive adhesive includes the following components (a) to (d):
(a) radical polymerizable compound with bridged hydrocarbon residue,
(b) an organic peroxide,
(c) a thermoplastic resin, and
(d) conductive particles for anisotropic conductive connection. In the radical polymerizable compound of component (a), it is desirable that the bridged hydrocarbon residue may be a tricyclodecane residue, and that it contain two or more unsaturated bonds.

12 Claims, No Drawings

ANISOTROPIC CONDUCTIVE ADHESIVE

BACKGROUND OF THE INVENTION

1. Field of the Invention

The present invention relates to an anisotropic conductive adhesive which permits low-temperature connections below 150° C. while exhibiting high continuity reliability and satisfactory adhesive strength.

2. Description of the Related Art

Anisotropic conductors with conductive particles dispersed in an adhesive binder have long been in use. The main adhesive binders used for this purpose are thermofusing resins which can form connections through thermocompression-bonding at relatively low temperatures (up to about 150° C.) and relatively quickly (about 10–20 seconds), as well as thermohardening resins which can only form connections through thermo-bonding at relatively high temperatures (about 150–200° C.) for long periods of time (20–30 seconds), with thermohardening resins being more widely used than thermofusing resins, because the former is better than the latter in respect of heat resistance, moisture resistance and chemical resistance.

Recently, however, as electronic devices have become smaller and lighter, it has been required to form, by use of anisotropic conductive adhesives, connections between fine circuits on the objects of contact, and to this end, it is necessary to achieve high insulation between adjacent terminals on fine circuits while at the same time minimizing the damage caused by heat to the objects of contact during heating adhesion. However, when the adhesive binder in an anisotropic conductive adhesive is a thermohardening resins such as those mentioned above which require relatively extended, high-temperature heating, the heat damage to the objects of contact during heating adhesion cannot be sufficiently minimized because the heating temperature required for hardening is too high.

Therefore, in order to produce an anisotropic conductive adhesive which permits low-temperature connections despite containing thermohardening resin as an adhesive binder, it has been proposed that a radical polymerizable resin (thermohardening component) such as vinyl ester resin and an organic peroxide (polymerization initiator) such as 1,1,3,3-tetramethyl- butylperoxy-2-ethylhexanoate be selected to form a combination of thermohardening component and polymerization initiator where the combination can give both rapid cold setting and storage stability properties to the anisotropic conductive adhesive, that an AB resin (acrylonitril-butylene copolymer resin) or other thermoplastic elastomer be selected as a film forming component, and that hardenable amine-modified maleimide resin be selected as the component which promotes compatibility between radical polymerizable resin and the thermoplastic elastomer which are incompatible to each other (Japanese Patent Application Laid-open No. H10-147762).

The problem is that when an anisotropic conductive adhesive such as that presented in Japanese Patent Application Laid-open No. H10-147762 was applied to the connections in a modern large-scale LCD (15 inches or more), efforts to prevent heat damage during thermocompression-bonding often led to a difference in bonding temperature (uneven temperature) between the center and edges of the thermocompression-bonding area, resulting in an uneven hardening rate (80%–100%). This is because the size of the thermocompression-bonding area (vertical and horizontal) of anisotropic conductive adhesive has grown while the same batch thermocompression-bonding processes are still being used for the connection. With an uneven hardening rate, the desired initial conduction and initial adhesion characteristics could still be obtained if the hardening rate was at least 80%, but the problem was that at an 80% hardening rate, environmental tests (85° C./85 RH %/500 hrs) showed higher continuity resistance, lower adhesion strength and lifting (peeling) of the thermocompression-bonding area. These problems are more serious in the case of an anisotropic conductive adhesive with relatively high cohesion, such as that presented in Japanese Patent Application Laid-open No. H10-147762, and in some cases the connection may open.

Because of their high degree of heat contraction during hardening, moreover, radical polymerizable resins such as vinyl ester have strong internal stress of the anisotropic conductive film after connection, thereby making it difficult to obtain sufficient adhesive strength. In addition, when connecting fine terminals to each other, there is a danger that a contraction of the distance between adjacent terminals will result in shorts between conductive particles.

Moreover, in order to make the radical polymerizable resin compatible with the thermoplastic elastomer, a hardenable amine-modified maleimide resin should be added to an anisotropic conductive adhesive, thereby greatly increasing manufacturing costs.

SUMMARY OF THE INVENTION

In an effort to solve the aforementioned problems of prior art, it is an object of the present invention to achieve satisfactory initial characteristics and characteristics after environmental testing in an anisotropic conductive adhesive containing a radical polymerizable compound and an organic peroxide, without using amine-modified maleimide resin.

The inventor perfected the present invention when he discovered that the aforementioned object could be achieved by using as the radical polymerizable compound a compound with a bridged structure in its molecular structure.

Namely, the present invention provides an anisotropic conductive adhesive, comprising the following components (a) to (d):

(a) a radical polymerizable compound with bridged hydrocarbon residue;

(b) an organic peroxide;

(c) a thermoplastic resin; and (d) conductive particles for anisotropic conductive connection.

DESCRIPTION OF THE PREFERRED EMBODIMENTS

The present invention is explained in detail below.

The anisotropic conductive adhesive of the present invention contains (a) a radical polymerizable compound with bridged hydrocarbon residue, (b) an organic peroxide, (c) a thermoplastic resin and (d) conductive particles for anisotropic conductive connection.

Because the radical polymerizable compound of Component (a) used in the present invention has a twisted, bridged hydrocarbon residue within the molecular skeleton, its shrinkage rate during thermohardening is much smaller than that of other, ordinary radical polymerizable compounds such as vinyl ester resins and unsaturated polyester resins (10% or less), with the result that very little internal stress is produced in the anisotropic conductive film after hardening, and the anisotropic conductive adhesive can be made with as much adhesive strength as necessary. At the same time, since the strength of cohesion is not inferior to that of vinyl ester resins, for example, the reliability of the connection formed by the anisotropic conductive adhesive can be enhanced. Moreover, the glass transition temperature after hardening is high, 150° C. or higher, resulting in excellent heat resistance, moisture resistance and chemical resistance.

Examples of such bridged hydrocarbon residues include bicycloalkane residues such as bicyclooctane, bicyclononane and bicycloundecane residues and tricycloalkane residues such as tricycloheptane, tricyclodecane and tricyclododecane residues. Of these, the tricyclodecane residue is desirable, being relatively easy to obtain.

In order for the thermohardening properties of the radical polymerizable compound of Component (a) to be manifested, there must be two or more polymerizable functional groups within the molecule, and two or more unsaturated carbon-carbon bond residues are especially desirable. Preferable examples of such an unsaturated carbon-carbon bond residue include a (metha)acroyl residue part of which is an acroyl or methacroyl group. Specific examples include (metha)acroyl, (metha)acroyloxy and (metha)acroylmethyl groups.

A particularly desirable concrete example of the radical polymerizable compound of Component (a) is di(metha)acroyloxymethyl-tricyclodecane, which is shown in Formula 1:

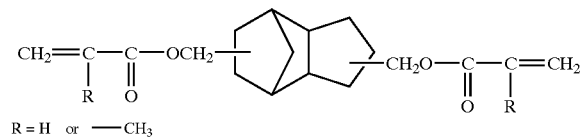

(1)

R = H or —CH₃

It is also possible to use ordinary radical polymerizable compounds such as vinyl ester resin in addition to the radical polymerizable compound with bridged hydrocarbon residue of Component (a), as long as the benefits of the invention are not sacrificed. In particular, it is desirable to add highly elastic urethane acrylate resin, which exhibits good adhesive strength by itself but does not tend to provide satisfactory continuity reliability because of its weak cohesion. By this means, it is possible to ensure continuity without losing the adhesive properties of the urethane acrylate resin.

For the organic peroxide of Component (b), which is the polymerization initiator, it is possible to use organic peroxides which are already well known as radical polymerization initiators. Those with 10-hour half-life temperatures of 30° C. to 90° C. are particularly desirable. As used here, "half-life" is an indicator of the speed of decomposition of the organic peroxide at a fixed temperature, and signifies the time required for active oxygen to be reduced by ½. Consequently, the 10-hour half-life temperature signifies the temperature at which the half-life is 10 hours, and is a useful indicator for selecting an organic peroxide with the half-life characteristics best suited to the radical polymerization reaction conditions.

Because of the rapidity of decomposition, the use of organic peroxides with 10-hour half-life temperatures below 30° C. is undesirable from the standpoint of promoting a safe polymerization reaction, while the use of organic peroxides with 10-hour half-life temperatures exceeding 90° C. is undesirable because the polymerization reaction proceeds too slowly.

Concrete examples of organic peroxides with 10-hour half-life temperatures between 30° C. and 90° C. include 1,1,3,3-tetramethyl butylperoxy-2-ethylhexanoate (65.3° C.), t-butylperoxy-2-ethylhexanoate (72.1° C.), t-hexylperoxy-2-ethylhexanoate (69.9° C.), 1,1-bis(t-butylperoxy)-3,3,5-trimethylcyclohexane (90.0° C.), 1,1-bis (t-hexylperoxy)-3,3,5-trimethylcyclohexane (86.7° C.) and bis(4-t-butylcyclohexyl)peroxydicarbonate (57.5° C.). Other examples are the organic peroxides listed on page 6 of *Organic Peroxides* (Nihon Yushi Co. Catalog No. 6). These peroxides may be used singly, or two or more organic peroxides may be combined for purposes of controlling hardenability. Further, known polymerization inhibitors may in advance be added to improve shelf life.

If the amount of the organic peroxide of Component (b) is too small in proportion to 100 parts by weight of the radical polymerizable compound of Component (a), the polymerization reaction speed is slow, resulting in some cases in conduction failure if hardening is not sufficient, while if the amount is too large the polymerization reaction rate is too fast, resulting in conduction failure when hardening occurs before compressing the binder enough, so a desirable amount is 1 to 15 parts by weight or preferably 2 to 5 parts by weight.

The thermoplastic resin of Component (c), which is a component for forming a film, may be one that is used in convention anisotropic conductive adhesives, and may preferably be compatible with the radical polymerizable compound of Component (a). For example, urethane resin, phenoxy resin, polyester resin and polysterene resin may be used as this thermoplastic resin. Use of urethane or phenoxy resin, etc. is particular desirable from the standpoint of obtaining satisfactory adhesive strength.

The amount of the thermoplastic resin of Component (c) is preferably be 50 to 150 parts or more preferably 80 to 130 parts by weight per 100 parts by weight of the radical polymerizable compound of Component (a), since if the amount is too small the film properties of the anisotropic conductive adhesive cannot be maintained, and adhesive strength deteriorates along with the ability to relax internal stress, while if the amount is too large the film properties will be too strong and tackiness will be less, making the anisotropic conductive adhesive difficult to use and detracting from heat-resistance, so that conduction failure will occur.

Well-known conductive particles can be used as the conductive particles for anisotropic conductive connection of Component (d). For example, particles of various metals such as nickel, iron, copper, aluminum, tin, lead, chrome, cobalt, silver or gold or metal alloys, or metal oxide, carbon, graphite, metal-coated glass and ceramic or plastic particles, etc., or such particles coated with an insulating thin film can be used. The size and material of these conductive particles may be selected as necessary depending on the pitch and pattern of the circuits to be connected, and the thickness and material, etc. of the circuit terminals.

If the amount of the conductive particles for anisotropic conductive connection of Component (d) is too small in proportion to 100 parts by weight of the radical polymerizable compound of Component (a) and the thermoplastic resin of Component (c) combined, the number of conductive particles between the facing terminals which are to form the anisotropic conductive connection will be reduced, raising the likelihood of conductive failure, while if the amount is too large shorts will occur between adjacent terminals on the same plane, so the amount is preferebly 1 to 30 parts by weight or more preferably 3 to 15 parts by weight.

Well-known coupling agents and other additives can be added as necessary to the anisotropic conductive adhesive of the present invention in addition to the aforementioned components (a) to (d).

The anisotropic conductive adhesive of the present invention can be manufactured by uniformly blending the aforementioned components (a) to (d) according to ordinary methods together with a solvent such as MEK or toluene. If necessary it should be painted on a peel sheet and dried to form a film for use.

EXAMPLES

The present invention is explained in detail below using examples.

Examples 1–7 and Comparative Examples 1–2

An anisotropic conductive adhesive was prepared by uniformly mixing the components shown in Table 1 together with 70 parts by weight of MEK, using a three-one motor. The resulting adhesive was painted on a peel treated polyester sheet with a bar coater and dried for 5 minutes in a 50° C. oven to produce an anistropic conductive adhesive film.

TABLE 1

|  | Example | | | | | | | Comparative Example | |
|---|---|---|---|---|---|---|---|---|---|
|  | 1 | 2 | 3 | 4 | 5 | 6 | 7 | 1 | 2 |
| Radical polymerizable compound | | | | | | | | | |
| DCP*1 | 40 | — | 20 | 20 | 20 | 40 | 60 | — | — |
| A-DCP*2 | — | 40 | — | — | — | — | — | — | — |
| M-210*3 | — | — | 20 | — | — | — | — | 40 | — |
| M-1310*4 | — | — | — | 20 | — | — | — | — | 40 |
| Organic Peroxide Peroyl L*5 | 5 | 5 | 5 | 5 | 5 | 5 | 5 | 5 | 5 |
| Thermoplactic resin PKHH*6 | 20 | 20 | 20 | 20 | 35 | 25 | 15 | 20 | 20 |
| N3100*7 | 20 | 20 | 20 | 20 | 35 | 25 | 15 | 20 | 20 |
| Conductive particle Micropearl AU-205*8 | 15 | 15 | 15 | 15 | 5 | 5 | 5 | 15 | 15 |

*1: Dimethacryloyloxymethyl-tricyclodecane, available from Shin-Nakamura Chemical Co.
*2: Diacroyloxymethyl-tricyclodecane, available from Shin-Nakamura Chemical Co.
*3: Bisphenol A EO modified diacrylate, available from Toa Gosei Co.
*4: Urethane acrylate, available from Toa Gosei Co.
*5: Diacyl peroxide, available from Nihon Yushi Co.
*6: Bisphenol A phenoxy resin, available from Tomoe Kogyo Co.
*7: Urethane resin, available from Nihon Polyurethane Kogyo Co.

The shrinkage rates for each of the radical polymerizable compounds used were as shown in Table 2, with the shrinkage rate defined as the difference in specific gravity before and after hardening divided by the specific gravity before hardening when a uniform mixture of 30 parts by weight of the radical polymerizable compound and 1 part by weight of Peroyl L was thermohardened for 60 minutes at 150° C. in a nitrogen atmosphere, and specific gravity measured before and after hardening.

TABLE 2

| Radical Polymerizable Compound | Shrinkage rate (%) |
|---|---|
| DCP | 7.8 |
| A-DCP | 8.1 |
| M-210 | 18.3 |
| M-1310 | 12.5 |

Evaluation

The resulting anisotropic conductive adhesive films were slit in 2 mm widths, a 200 μm pitch TAB and a 200 μm pitch printed circuit board were compression-bonded at 140° C., 294 N/cm$^2$, and continuity resistance and adhesive strength (peeling adhesive strength, JIS K6854) were measured after compression bonding and after environmental testing (85° C./85 RH %/500 hrs). The results are shown in Tables 3 and 4. A continuity resistance value in excess of 1Ω was judged unacceptable, and an adhesive strength value below 6 N/cm was judged unacceptable.

A continuity resistance values were measured by the so-called 4-terminal method. Specifically, they were measured as explained below.

First, a printed wiring board was prepared having a TAB connection terminal (A) continuous with two external connection terminals (a and b) and a separate TAB connection terminal (B) continuous with two other external connection terminals (c and d), and another TAB was prepared having a printed wiring board connection terminal (X) continuous with two external connection terminals (w and x) and a separate printed wiring board connection terminal (Y) continuous with two other external connection terminals (y and z). Anisotropic conductive adhesive was then used to connect the printed wiring board to the TAB (A-X and B-Y), and after connection continuity resistance was measured between a or b and w or x, or between c or d and y and z.

TABLE 3

|  | Example | | | | | | |
|---|---|---|---|---|---|---|---|
|  | 1 | 2 | 3 | 4 | 5 | 6 | 7 |
| Continuity resistance (Ω) Initial | | | | | | | |
| Max | 0.036 | 0.036 | 0.036 | 0.036 | 0.036 | 0.036 | 0.036 |
| Min | 0.028 | 0.028 | 0.028 | 0.028 | 0.028 | 0.028 | 0.028 |
| Average | 0.031 | 0.031 | 0.031 | 0.031 | 0.031 | 0.031 | 0.031 |

TABLE 3-continued

|  | Example | | | | | | |
|---|---|---|---|---|---|---|---|
|  | 1 | 2 | 3 | 4 | 5 | 6 | 7 |
| After environmental Testing | | | | | | | |
| Max | 0.041 | 0.041 | 0.041 | 0.043 | 0.041 | 0.040 | 0.041 |
| Min | 0.030 | 0.030 | 0.030 | 0.030 | 0.031 | 0.030 | 0.030 |
| Average | 0.036 | 0.036 | 0.036 | 0.038 | 0.036 | 0.036 | 0.036 |
| Adhesive strength (N/cm) Initial | | | | | | | |
| Max | 10.8 | 10.2 | 9.5 | 12.8 | 9.3 | 12.5 | 10.8 |
| Min | 7.5 | 7.3 | 7.1 | 8.8 | 3.5 | 8.8 | 7.5 |
| Average | 9.9 | 9.3 | 9.0 | 11.0 | 5.8 | 10.5 | 9.9 |
| After environmental Testing | | | | | | | |
| Max | 9.5 | 9.0 | 8.3 | 11.0 | 9.3 | 9.5 | 9.5 |
| Min | 7.2 | 6.6 | 6.8 | 8.8 | 7.2 | 7.8 | 7.2 |
| Average | 8.1 | 7.8 | 7.6 | 9.9 | 7.5 | 8.0 | 8.1 |

TABLE 4

|  |  | Comparative Example | |
|---|---|---|---|
|  |  | 1 | 2 |
| Continuity resistance (Ω) | | | |
| Initial | Max | 0.038 | 0.045 |
|  | Min | 0.028 | 0.031 |
|  | Average | 0.032 | 0.035 |
| After environmental Testing | Max | 0.051 | 1.533 |
|  | Min | 0.031 | 0.081 |
|  | Average | 0.046 | 0.985 |
| Adhesive strength (N/cm) | | | |
| Initial | Max | 7.3 | 12.5 |
|  | Min | 3.5 | 8.8 |
|  | Average | 5.8 | 10.5 |
| After environmental Testing | Max | 6.3 | 9.5 |
|  | Min | 3.2 | 7.8 |
|  | Average | 4.5 | 8.0 |

From Table 3 and 4 it is clear that with the anisotropic conductive adhesive films of Examples 1–7, which have as the radical polymerizable compound either DCP with a bridged hydrocarbon residue (tricyclodecane residue), a shrinkage rate of 7.8% and a glass transition temperature of 150° C. or higher, or A-DCP with a bridged hydrocarbon residue (tricyclodecane), a shrinkage rate of 8.1% and a glass transition temperature of 150° C. or higher, continuity resistance initially and after environmental testing does not exceed 1Ω and adhesive strength does not fall below 6 N/cm even at compression-bonding temperatures below 150° C. From the results for Examples 5 to 7, it is clear that adhesive strength tends to be lower the lower the proportion of the radical polymerizable compound with bridged hydrocarbon residue.

By contrast, adhesive strength was a problem in the case of the anisotropic conductive adhesive film of Comparative Example 1, in which the radical polymerizable compound is bisphenol A EO-modified diacrylate alone, which has no bridged hydrocarbon residue, a shrinkage rate of 18.3% and a glass transition temperature of 75° C. Adhesive strength can be restored, however, if half of the bisphenol A EO-modified diacrylate is replaced with those having bridged hydrocarbon residue (see Example 3).

Moreover, continuity resistance was shown to be dramatically higher after environmental testing in the case of the anisotropic conductive adhesive film of Comparative Example 2, in which the radical polymerizable compound is urethane acrylate alone, which has no bridged hydrocarbon residue, a shrinkage rate of 12.5% and a glass transition temperature of −25° C. It is shown that continuity resistance after environmental testing can be restored, however, if half the urethane acrylate is replaced with those having bridged hydrocarbon residue (see Example 4).

With the anisotropic conductive adhesive of the present invention, which contains a radical polymerizable compound and an organic peroxide, satisfactory initial properties and properties after environmental testing are achieved without the use of amine modified maleimide resin.

The entire disclosure of the specification, summary and claims of Japanese Patent Application No. 2000-381939 filed on Dec. 15, 2000 is hereby incorporated by reference.

What is claimed is:

1. An anisotropic conductive adhesive, comprising the following components (a)–(d):
 (a) a radical polymerizable compound with bridged hydrocarbon residue;
 (b) an organic peroxide;
 (c) a thermoplastic resin; and
 (d) conductive particles for anisotropic conductive connection;
 wherein the bridged hydrocarbon residue in the radical polymerizable compound of Component (a) is a bicycloalkane residue or tricycloalkane residue.

2. The anisotropic conductive adhesive of claim 1, wherein the radical polymerizable compound of Component (a) has two or more unsaturated carbon-carbon bond residues.

3. The anisotropic conductive adhesive of claim 2, wherein the unsaturated carbon-carbon bond residues are (metha)acroyl groups.

4. The anisotropic conductive adhesive of claim 1, wherein the organic peroxide of Component (b) has a 10-hour half-life temperature of 30° C. to 90° C.

5. The anisotropic conductive adhesive of claim 1, wherein the thermoplastic resin of Component (c) is urethane resin and/or phenoxy resin.

6. The anisotropic conductive adhesive of claim 1, wherein Component (b) is contained in an amount of 1 to 15 parts by weight per 100 parts by weight of Component (a), Component (c) is contained in an amount of 50 to 150 parts by weight per 100 parts by weight of Component (a), and Component(d) is contained in an amount of 1 to 30 parts by weight per 100 parts by total weight of Components (a) and (c) combined.

7. An anisotropic conductive adhesive, comprising the following components (a)~(d):
   (a) a radical polymerizable compound with bridged hydrocarbon residue;
   (b) an organic peroxide;
   (c) a thermoplastic resin; and
   (d) conductive particles for anisotropic conductive connection;
   wherein the radical polymerizable compound with bridged hydrocarbon residue of Component (a) is di(metha)acroyloxymethyl-tricyclodecane.

8. The anisotropic conductive adhesive of claim 7, wherein the radical polymerizable compound of Component (a) has two or more unsaturated carbon-carbon bond residues.

9. The anisotropic conductive adhesive of claim 8, wherein the unsaturated carbon-carbon bond residues are (metha)acroyl groups.

10. The anisotropic conductive adhesive of claim 7, wherein the organic peroxide of Component (b) has a 10-hour half-life temperature of 30° C. to 90° C.

11. The anisotropic conductive adhesive of claim 7, wherein the thermoplastic resin of Component (c) is urethane resin and/or phenoxy resin.

12. The anisotropic conductive adhesive of claim 7, wherein Component (b) is contained in an amount of 1 to 15 parts by weight per 100 parts by weight of Component (a), Component (c) is contained in an amount of 50 to 150 parts by weight per 100 parts by weight of Component (a), and Component (d) is contained in an amount of 1 to 30 parts by weight per 100 parts by total weight of Components (a) and (c) combined.

\* \* \* \* \*